（12）United States Patent
Tanabe et al.

(10) Patent No.: US 10,256,234 B2
(45) Date of Patent: Apr. 9, 2019

(54) SEMICONDUCTOR DEVICE

(71) Applicant: DENSO CORPORATION, Kariya, Aichi-pref. (JP)

(72) Inventors: Hiromitsu Tanabe, Kariya (JP); Kenji Kouno, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/570,834

(22) PCT Filed: Jul. 22, 2016

(86) PCT No.: PCT/JP2016/071515
§ 371 (c)(1),
(2) Date: Oct. 31, 2017

(87) PCT Pub. No.: WO2017/033636
PCT Pub. Date: Mar. 2, 2017

(65) Prior Publication Data
US 2018/0151557 A1 May 31, 2018

(30) Foreign Application Priority Data

Aug. 21, 2015 (JP) .................... 2015-163924

(51) Int. Cl.
*H01L 27/00* (2006.01)
*H01L 29/00* (2006.01)
(Continued)

(52) U.S. Cl.
CPC ........ *H01L 27/0664* (2013.01); *H01L 21/221* (2013.01); *H01L 27/0727* (2013.01);
(Continued)

(58) Field of Classification Search
CPC ... H01L 21/221; H01L 21/263; H01L 21/265; H01L 21/26513; H01L 21/046;
(Continued)

(56) References Cited

U.S. PATENT DOCUMENTS 6,054,748 A * 4/2000 Tsukuda ............... H01L 29/0615
257/487
8,952,449 B2 * 2/2015 Koyama ............... H01L 21/263
257/330
(Continued)

FOREIGN PATENT DOCUMENTS

JP 2008-192737 A 8/2008
JP 2013-149909 A 8/2008
(Continued)

*Primary Examiner* — Nikolay K Yushin
(74) *Attorney, Agent, or Firm* — Posz Law Group, PLC

(57) ABSTRACT

A semiconductor device includes a semiconductor substrate provided with an IGBT cell having a collector region and a diode cell having a cathode region, a first defect layer and a second defect layer in a drift region. A region present in the drift region and surrounded by an interface between the IGBT cell and the diode cell orthogonal to a first principal plane, and a plane passing through a boundary between the collector region and the cathode region on a boundary line along an interface between the collector region and the drift region and crossing the first principal plane at an angle of 45 degrees is referred to as a boundary region. The diode cell satisfies a relationship of $S_{D1} > S$, in which S is an area occupied by the boundary region and $S_{D1}$ is an area occupied by the diode cell in a surface of the drift region.

14 Claims, 6 Drawing Sheets

(51) Int. Cl.
*H01L 27/06* (2006.01)
*H01L 29/739* (2006.01)
*H01L 29/78* (2006.01)
*H01L 21/22* (2006.01)
*H01L 29/10* (2006.01)
*H01L 29/32* (2006.01)
*H01L 27/07* (2006.01)
*H01L 21/00* (2006.01)
*H01L 21/265* (2006.01)

(52) U.S. Cl.
CPC .......... *H01L 29/1095* (2013.01); *H01L 29/32* (2013.01); *H01L 29/739* (2013.01); *H01L 29/7391* (2013.01); *H01L 29/7397* (2013.01); *H01L 29/78* (2013.01); *H01L 21/26506* (2013.01)

(58) Field of Classification Search
CPC ............. H01L 27/0664; H01L 27/0727; H01L 27/0761; H01L 27/15; H01L 29/1095; H01L 29/32; H01L 29/7397
See application file for complete search history.

(56) References Cited

U.S. PATENT DOCUMENTS

| | | |
|---|---|---|
| 2005/0258493 A1 | 11/2005 | Aono et al. |
| 2010/0090248 A1 | 4/2010 | Kouno |
| 2012/0043582 A1* | 2/2012 | Koyama ............... H01L 21/263 257/140 |
| 2012/0132955 A1 | 5/2012 | Saito et al. |
| 2012/0319163 A1 | 12/2012 | Tsuzuki et al. |
| 2013/0240947 A1 | 9/2013 | Matsudai et al. |
| 2013/0260515 A1 | 10/2013 | Mizushima |
| 2016/0035869 A1 | 2/2016 | Matsudai et al. |
| 2016/0254264 A1 | 9/2016 | Mizushima |
| 2017/0077216 A1 | 3/2017 | Kouno |

FOREIGN PATENT DOCUMENTS

| | | |
|---|---|---|
| JP | 2008-211148 A | 9/2008 |
| JP | 2010-147381 A | 7/2010 |

\* cited by examiner

SEMICONDUCTOR DEVICE

CROSS REFERENCE TO RELATED APPLICATIONS

This application is a U.S. national stage of International Patent Application No. PCT/JP2016/071515 filed on Jul. 22, 2016 and is based on Japanese Patent Application 2015-163924 filed on Aug. 21, 2015, the disclosures of which are incorporated herein by reference.

TECHNICAL FIELD

The present disclosure relates to a semiconductor device including an insulated gate bipolar transistor (IGBT) and a diode provided to a same semiconductor substrate.

BACKGROUND ART

A life time control by ion irradiation is often performed in a so-called reverse conducting insulated gate bipolar transistor (RC-IGBT) including an IGBT and a diode provided to a same semiconductor substrate.

In a semiconductor device described in Patent Literature 1, ions are radiated intensively to a diode cell. In comparison with a case where ions are radiated across an entire surface of the semiconductor substrate, a life time in the diode cell can be controlled while an ON voltage of the IGBT can be decreased. In the semiconductor device, an ion irradiation portion protrudes from the diode cell into an IGBT cell to restrict a charge injection from the IGBT cell to the diode cell using a lattice defect layer provided by ion irradiation. A switching loss and a recovery loss can be thus reduced.

However, a reducing effect on switching loss and recovery loss is not exerted sufficiently when a protrusion amount of the lattice defect layer provided by ion irradiation into the IGBT cell is small. Conversely, when a protrusion amount of the lattice defect layer into the IGBT cell is large, characteristics of an ON voltage may possibly deteriorate.

PRIOR ART LITERATURE

Patent Literature

Patent Literature 1: JP 2011-216825 A

SUMMARY OF INVENTION

It is an object of the present disclosure to provide a semiconductor device capable of reducing a switching loss and a recovery loss while decreasing an ON voltage.

A semiconductor device according to an aspect of the present disclosure includes a semiconductor substrate having a first principal plane and a second principal plane as a back surface and provided with an IGBT cell having a collector region in a surface layer of the semiconductor substrate adjacent to the second principal plane and a diode cell having a cathode region on the surface layer of the semiconductor substrate of the second principal plane. The semiconductor substrate includes a drift region that forms a charge transfer path between the first principal plane and the second principal plane. The semiconductor device further includes a first defect layer disposed in the drift region of the diode cell as a lattice defect layer provided by ion irradiation, and a second defect layer disposed to extend from the first defect layer of the diode cell into the IGBT cell and provided at a same time as the first defect layer. A region present in the drift region and surrounded by an interface between the IGBT cell and the diode cell orthogonal to the first principal plane, and a plane passing through a boundary between the collector region and the cathode region on a boundary line along an interface between the collector region and the drift region and crossing the first principal plane at an angle of 45 degrees is referred to as a boundary region. The diode cell is disposed to satisfy a relationship of $S_{D1} > S$, in which S is an area occupied by the boundary region and $S_{D1}$ is an area occupied by the diode cell in a surface of the drift region adjacent to the first principal plane.

According to a result of a device simulation conducted by the inventors, since the diode cell is configured to satisfy the relationship of $S_{D1} > S$, a sum of a switching loss (Eon) and a recovery loss (Err) can be smaller than in the configuration in the related art. A sum becomes smaller because a proportion of a charge amount accumulated in the boundary region in a total charge amount accumulated in the diode cell and the boundary region can be reduced. That is, by adopting the semiconductor device as above, Eon+Err can be reduced without having to increase an ON voltage when the IGBT cell is in operation. Hence, a recovery loss of the diode can be restricted without having to increase an area occupied by the second defect layer in the IGBT cell more than necessary. In other words, a trade-off between an ON voltage of the IGBT and a recovery loss of the diode no longer has to be made.

Meanwhile, an effect same as the effect described above can be obtained also by increasing a proportion of a charge amount accumulated in the diode cell in a total charge amount accumulated in the diode cell and the boundary region.

A semiconductor device according to another aspect of the present disclosure includes: a semiconductor substrate having a first principal plane and a second principal plane as a back surface and provided with an IGBT cell having a collector region in a surface layer of the semiconductor substrate adjacent to the second principal plane and a diode cell having a cathode region in the surface layer of the semiconductor substrate adjacent to the second principal plane. The semiconductor substrate includes a drift region that forms a charge transfer path between the first principal plane and the second principal plane. The semiconductor device further includes a first defect layer disposed in the drift region of the diode cell as a lattice defect layer provided by on irradiation, and a second defect layer disposed to extend from the first defect layer in the diode cell into the IGBT cell and provided at a same time as the first defect layer. The IGBT cell and the diode cell are provided in such a manner that a density of a current flowing through the drift region when the diode cell is in operation is higher than a density of a current flowing through the drift region when the IGBT cell is in operation. An ion irradiation amount to provide the lattice defect layer is determined so that a total charge amount accumulated in the drift region is equal to a predetermined amount set in advance according to a forward voltage-to-loss characteristic when the diode cell is in operation.

An ion irradiation amount to provide the lattice defect layer is determined according to a forward voltage-to-loss characteristic when the diode cell is in operation. More specifically, an ion irradiation amount is determined for a predetermined charge amount set in advance to be accumulated in the drift region. That is, a proportion of a charge amount accumulated in the diode cell can be increased while maintaining a total charge amount in the drift region constant. Hence, an increase in loss caused by charges accumulated in a vicinity of a boundary between the diode cell and the IGBT cell can be restricted. In other words, excessive charge injection from the IGBT cell to the diode region can be restricted. Consequently, Eon+Err can be reduced without having to increase a protrusion amount of the second defect layer.

When viewed from another point, the above configuration means that an ion irradiation amount to provide the first defect layer needs to be increased in comparison with the configuration in the related art. That is, because an irradiation amount to provide the second defect layer is increased in comparison with the ion irradiation amount in the related art, a charge injection amount from the IGBT cell to the diode cell is restricted by the boundary region. Hence, a recovery loss when the diode cell is in operation can be reduced. Consequently, a recovery loss of the diode can be also restricted without having to increase an area occupied by the second defect region in the IGBT cell more than necessary. In other words, a trade-off between an ON voltage of the IGBT and a recovery loss of the diode no longer has to be made.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
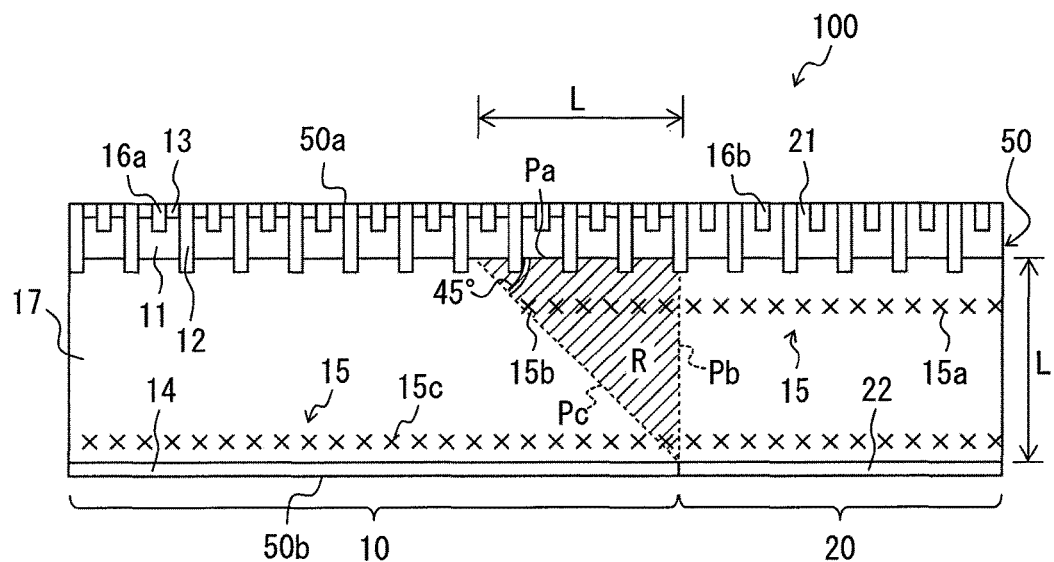
FIG. 1 is a sectional view showing a schematic configuration of a semiconductor device according to a first embodiment.

Hereinafter, embodiments of the present disclosure will be described with reference to the drawings. In respective drawings, same or equivalent portions are designated with same reference numerals.

First Embodiment

Firstly, a schematic configuration of a semiconductor device of the present embodiment will be described with reference to FIG. 1 and FIG. 2.

As is shown in FIG. 1, a semiconductor device 100 is so-called a reverse conducting IGBT, abbreviated to RC-IGBT, including an IGBT cell 10 and a diode cell 20 provided to a single semiconductor substrate 50. As components forming the IGBT cell 10, the semiconductor device 100 has a base region 11, a trench gate 12, an emitter region 13, a collector region 14, and a lattice defect layer 15.

As components forming the diode cell 20, the semiconductor device 100 has an anode region 21 and a cathode region 22.

The semiconductor device 100 of the present embodiment further has a base contact region 16a surrounded by the base region 11, and an anode contact region 16b surrounded by the anode region 21. In the following, the base contact region 16a and the anode contact region 16b are referred to collectively also as a contact region 16.

A drift region 17 is provided between the base region 11 and the collector region 14 and between the anode region 21 and the cathode region 22.

The semiconductor substrate 50 is made of silicon doped with an impurity and has n-type conductivity. The semiconductor substrate 50 is cut out from a silicon wafer and has a first principal plane 50a and a second principal plane 50b as a back surface. The IGBT cell 10 and the diode cell 20 are provided by implanting ions into the respective principal planes. In the present embodiment, when the first principal plane 50a is viewed from a front, a portion having the collector region 14 is referred to as the IGBT cell 10 and a portion having the cathode region 22 is referred to as the diode cell 20.

In the IGBT cell 10, the base region 11 is provided in a surface layer of the semiconductor substrate 50 on a side of the first principal plane 50a. The base region 11 is doped with an impurity, for example, boron and has p-type conductivity. The base region 11 forms a channel when a predetermined voltage is applied to the trench gate 12 described below. A current thus flows between the emitter region 13 and the collector region 14.

The trench gate 12 is provided to extend in a depth direction of the semiconductor substrate 50 from the first principal plane 50a. The trench gate 12 is provided to reach the drift region 17 described below by penetrating through the base region 11. The trench gate 12 has a structure formed by covering an inner wall of a trench provided to the first principal plane 50a of the semiconductor substrate 50 with an insulating film and filling the trench with polysilicon. The structure is well known and is not shown in detail in FIG. 1. The trench gate 12 is connected to a gate terminal, which is a control terminal of the IGBT cell 10, and used for a switching control.

The emitter region 13 is selectively provided in the surface layer of the semiconductor substrate 50 on the side of the first principal plane 50a. The emitter region 13 is doped with an impurity, for example, arsenic or phosphorous and has n-type conductivity. The emitter region 13 is provided to be in contact with the trench gate 12 while covering the base region 11. The emitter region 13 is provided only to a portion corresponding to the IGBT cell 10 and connected to an emitter terminal, which is an output terminal of the IGBT cell 10, at, for example, GND potential.

The collector region 14 is provided to a surface layer of the semiconductor substrate 50 on a side of the second principal plane 50b in the IGBT cell 10. The collector region 14 is doped with an impurity, for example, boron, and has p-type conductivity. Impurity concentration of the collector region 14 is higher than impurity concentration of the base region 11. The collector region 14 is connected to a collector terminal, which is an output terminal of the IGBT cell 10. A collector current thus flows between the collector region 14 and the emitter region 13.

In the diode cell 20, the anode region 21 is provided in the surface layer of the semiconductor substrate 50 on the side of the first principal plane 50a. The anode region 21 is doped with an impurity, for example, boron, and has p-type conductivity. The anode region 21 and the base region 11 of the IGBT cell 10 can be formed in a same process. The anode region 21 and the base region 11 are same in depth from the first principal plane 50a and impurity concentration. The anode region 21 forms a PN junction between the cathode region 22 and the drift region 17 both described below, and exerts a diode function.

The cathode region 22 is provided in the surface layer of the semiconductor substrate 50 on the side of the second principal plane 50b in the diode cell 20. The cathode region 22 is doped with an impurity, for example, arsenic or phosphorous and has n-type conductivity. Impurity concentration of the cathode region 22 is higher than impurity concentration of the semiconductor substrate 50.

The lattice defect layer 15 is a layer adjusting a charge accumulation amount by shortening a life time of charges transferring in the drift region 17. The lattice defect layer 15 is provided by giving damage on a crystal structure of the semiconductor substrate 50 by ion irradiation and causing a lattice defect. Examples of an ion species irradiated to the semiconductor substrate 50 include but not limited to protons, helium ions, and argon ions.

The lattice defect layer 15 of the present embodiment has a first defect layer 15a provided to the drift region 17 on the side of the first principal plane 50a in the diode cell 20, a second defect layer 15b provided to continuously protrude from the first defect layer 15a into the IGBT cell 10, and a third defect layer 15c provided on the side of the second principal plane 50b across both the IGBT cell 10 and the diode cell 20. The first defect layer 15a controls a forward voltage (VF) and a recovery loss (Err) when the diode cell is in operation. The second defect layer 15b functions as a barrier preventing unexpected charge injection from the IGBT cell 10 when the diode cell is in operation. A preferable protrusion amount of the second defect layer 15b from an interface Pb between the IGBT cell 10 and the diode cell 20 is 300 µm or less. The third defect layer 15c is provided to control an ON voltage (Von) and a switching loss (Eon) of the IGBT in the IGBT cell 10 and to control a forward voltage (VF) and a recovery loss (Err) in the diode cell 20.

As an amount of radiated ions is increased, the lattice defect layer 15 is damaged more severely and hence a life time of charges can be shorter. That is, a designer is able to adjust characteristics of Von, Eon, VF, and Err with an ion irradiation amount. In other words, an ion radiation amount has to be set to satisfy required Von, Eon, VF, and Err. Ion irradiation amounts, that is, ion irradiation times of the first defect layer 15a, the second defect layer 15b, and the third defect layer 15c can be adjusted to best suit required use. In the present embodiment, ion irradiation times of the respective defect layers 15a through 15c are set so that life times of charges are set to 0.01 µs to 10 µs.

The base contact region 16a and the anode contact region 16b are p-type conductive semiconductor regions at higher impurity concentration than the base region 11 and the anode region 21, respectively. The contact region 16 functions as an anode when the semiconductor device 100 operates as a diode, and functions to efficiently extract charges injected from the collector region 14 to the semiconductor substrate 50 when the semiconductor device 100 operating as an IGBT is turned off.

The drift region 17 is a region defined when the base region 11, the collector region 14, the anode region 21, and the cathode region 22 are provided to the semiconductor substrate 50. More specifically, the drift region 17 is regions between the base region 11 and the collector region 14 and between the anode region 21 and the cathode region 22. It goes without saying that the drift region 17 has n-type conductivity and same impurity concentration as the semiconductor substrate 50.

For ease of description, a term, "a boundary region" referred to below is defined as follows. That is, as is indicated by diagonal lines of FIG. 1, a region enclosed by a surface Pa of the drift region 17 on the side of the first principal plane 50a, the interface Pb between the IGBT cell 10 and the diode cell 20, and a plane Pc passing through a boundary between the collector region 14 and the cathode region 22 on a boundary line along an interface between the drift region 17 and the collector region 14 and crossing the first principal plane 50a at an angle of 45 degrees is defined as a boundary region R.

The boundary region R is a three-dimensional region and provided along the interface between the IGBT cell 10 and the diode cell 20. According to the definition above, the plane Pc crosses the first principal plane 50a at an angle of approximately 45 degrees. Hence, a protrusion amount of the surface Pa from the diode cell 20 in the boundary region R is comparable to a thickness L of the drift region 17. An angle of the plane Pc with respect to the first principal plane 50a is 45 degrees because charges injected into the drift region 17 from the cathode region 22 spread by approximately 45 degrees. As is shown in FIG. 2, an area S occupied by the boundary region in a surface of the drift region 17 on the side of the first principal plane 50a can be defined in accordance with the definition of the boundary region R. The area S depends on the thickness L of the drift region 17 and a shape of the diode cell 20 when the first principal plane 50a is viewed from the front.

Figure 2:
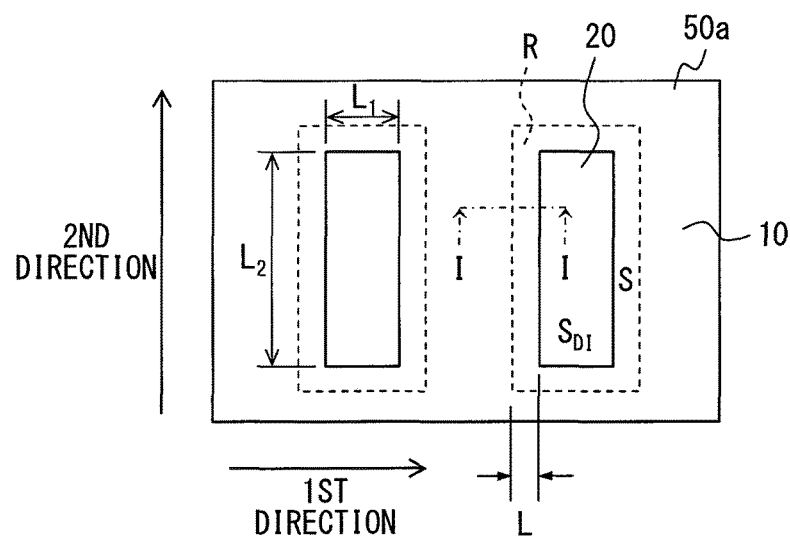
FIG. 2 is a top view showing a relationship between an IGBT cell and a diode cell regarding areas in the semiconductor device.

As shown in FIG. 2, the IGBT cell 10 and the diode cell 20 are repeatedly and alternately arranged in a first direction along the first principal plane 50a. A direction along the first principal plane 50a and perpendicular to the first direction is referred to as a second direction. The diode cell 20 of the present embodiment is of a rectangular shape when the first principal plane 50a is viewed from the front. A length $L_2$ of the diode cell 20 in the second direction is greater than a length $L_1$ of the diode cell 20 in the first direction. Herein, let $S_{D1}$ be an area of the diode cell 20. The boundary region R has a loop shape along an outer edge of the diode cell 20. The diode cell 20 of the present embodiment is provided so that the area S and the area $S_{D1}$ satisfy a relationship expressed by an inequality: $S_{D1} > S$.

Figure 3:
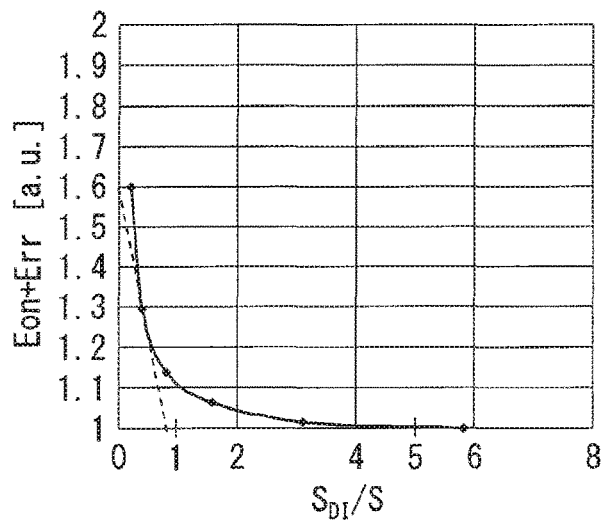
FIG. 3 is a graph showing a simulation result.

Advantageous effects of the semiconductor device 100 of the present embodiment will now be described with reference to FIG. 3 and FIG. 4.

Inventors had conducted a simulation on a variance in sum of a switching loss (Eon) and a recovery loss (Err) in response to a ratio of the area $S_{D1}$ of the diode cell 20 to the area S of the boundary region R, $S_{D1}/S$. A simulation result is set forth in FIG. 3. It is understood from FIG. 3 that Eon+Err can be reduced dominantly under a condition of $S_{D1}/S>1$ without having to increase a protrusion amount of the second defect layer 15b into the IGBT cell 10.

A switching loss Eon and a recovery loss Err are determined by a total charge amount accumulated in the drift region 17 and an injection amount from the IGBT cell 10 during a diode operation. The condition, $S_{D1}/S>1$, means to reduce a proportion of a charge amount in the boundary region R in a total charge amount, and it is a condition to sufficiently reduce an influence given to a loss of charges injected from the IGBT cell 10 to the diode cell 20.

When $S_{D1}/S$ is increased more than necessary, a diode recovery tolerance is decreased contrary to the intention. In a range, $S_{D1}/S>5$, Eon+Err gradually approaches a constant value and it is not necessary to increase the area $S_{D1}$ of the diode cell 20 more than necessary. In short, $S_{D1}/S<5$ is suitable. As has been described, by providing the diode cell 20 to satisfy a relationship expressed by an inequality, $S<S_{D1}<5S$, the semiconductor device 100 becomes capable of exerting a reduction effect on Eon+Err.

Figure 4:
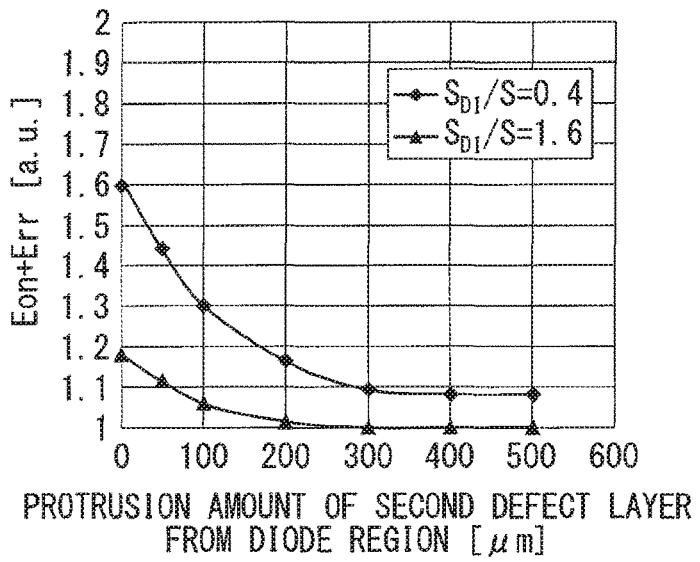
FIG. 4 is a graph showing another simulation result.

FIG. 4 reveals that Eon+Err depends on a protrusion amount of the second defect layer 15b. An amount of Eon+Err reduced by increasing $S_{D1}/S$ becomes noticeable when a protrusion amount of the second defect layer 15b is 300 μm or less. That is, when a protrusion amount of the second defect layer 15b is set to 300 μm or less, a loss reduction effect by increasing $S_{D1}/S$ is exerted significantly in the present embodiment.

However, the boundary region R is defined independently of the second defect layer 15b and a protrusion amount of the second defect layer 15b is not necessarily adjusted to adjust Eon+Err. That is, when the semiconductor device 100 of the present embodiment is adopted, Eon+Err can be reduced without having to increase an ON voltage (Von) when the IGBT cell 10 is in operation.

(First Modification)

Figure 5:
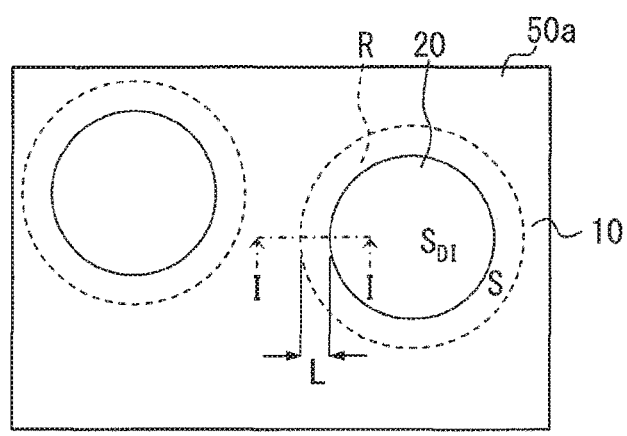
FIG. 5 is a top view showing a relationship between an IGBT cell and a diode cell regarding areas in a semiconductor device according to a first modification.

In order to satisfy the condition, $S_{D1}/S>1$, it is preferable to set a shape of the diode cell 20 to make the area $S_{D1}$ as small as possible for the area S. In a case where the diode cell 20 is formed in a perfect circular shape as is shown in FIG. 5 when the first principal plane 50a is viewed from the front, the area $S_{D1}$ of the boundary region R can be minimized in comparison with a case where the diode cell 20 having the same area is formed in other shapes.

Second Embodiment

The first embodiment above has described a case where a charge injection from the IGBT cell 10 to the diode cell 20 is restricted by providing the diode cell 20 to satisfy a predetermined condition on a relationship of the area $S_{D1}$ of the boundary region R along the first principal plane 50a and the area S of the diode cell 20. That is, the first embodiment above has described a case where a proportion of a charge amount accumulated in the boundary region R in a total charge amount is reduced. However, a same effect can be obtained by increasing a proportion of a charge amount accumulated in the diode cell 20 in a total charge amount. The present embodiment will describe a condition to provide a diode cell 20 without depending on an area ratio, $S_{D1}/S$.

Figure 6:
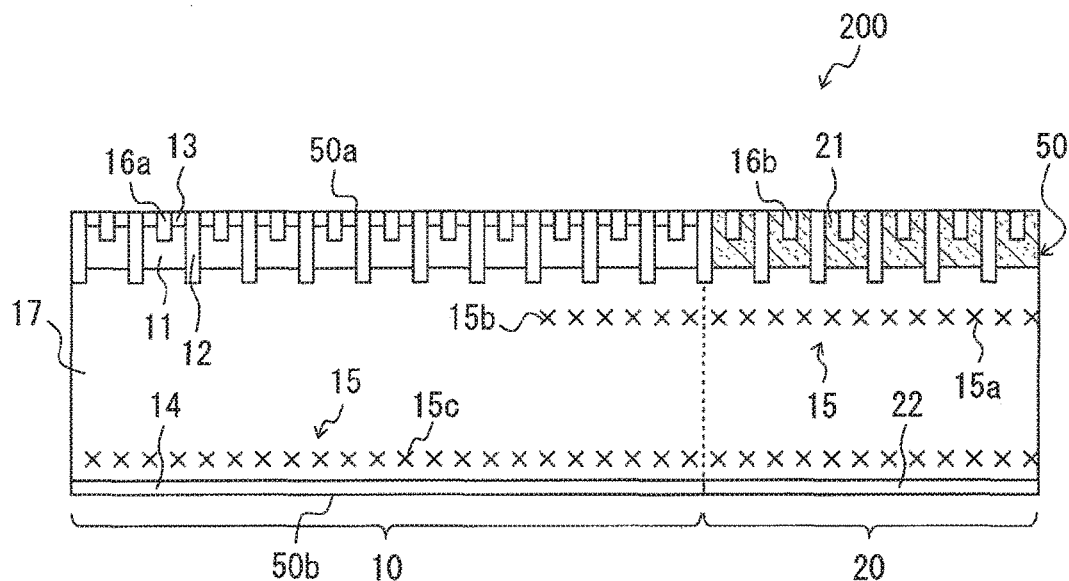
FIG. 6 is a sectional view showing a schematic configuration of a semiconductor device according to a second embodiment.

As in the first embodiment above and as is shown in FIG. 6, a semiconductor device 200 of the present embodiment has a base region 11, a trench gate 12, an emitter region 13, a collector region 14, and a lattice defect layer 15 as components forming an IGBT cell 10. Also, the semiconductor device 200 has an anode region 21 and a cathode region 22 as components forming the diode cell 20. The semiconductor device 200 further has a contact region 16 enclosed by the base region 11 or the anode region 21. A drift region 17 is provided between the base region 11 and the collector region 14 and between the anode region 21 and the cathode region 22.

The semiconductor device 200 of the present embodiment is same as the semiconductor device 100 of the first embodiment above except for impurity concentration of the anode region 21, ion irradiation amounts to provide a first defect layer 15a and a second defect layer 15b of the lattice defect layer 15, and a condition on an area ratio, $S_{D1}/S$, and a detailed description is omitted herein.

In the semiconductor device 200 of the present embodiment, no condition is set on an area ratio, $S_{D1}/S$, and impurity concentration is set higher in the anode region 21 than in the base region 11 instead. That is, in the present embodiment, the base region 11 and the anode region 21 are not formed in a same process and formed individually in separate processes.

Ion irradiation amounts to provide the first defect layer 15a and the second defect layer 15b are set to be greater than the ion irradiation amounts in the first embodiment above.

In the semiconductor device 200, impurity concentration is set higher in the anode region 21 than in the base region 11. Hence, an accumulated charge amount during diode conduction is increased in comparison with a condition that impurity concentration is same in the anode region 21 and the base region 11, in which case a recovery loss (Err) is increased. Nevertheless, an increase in Err can be restricted, because, as has been described above, ion irradiation amounts to provide the first defect layer 15a and the second defect layer 15b are set to be greater than the ion irradiation amounts in the first embodiment above.

As has been described above, ion irradiation amounts are set not to change a recover loss (Err) of the first embodiment above in a forward voltage-to-loss characteristic when the diode cell 20 is in operation. That is, ion irradiation amounts are set for a total charge amount accumulated in the drift region 17 during a diode operation to be equal to a predetermined value. Hence, an ion irradiation amount to provide the second defect layer 15b is increased relative to the ion irradiation amount in the first embodiment above. Owing to defects thus increased, the semiconductor device 200 is capable of restricting a charge injection amount from the IGBT cell 10 to the diode cell 20 without having to set a condition on an area ratio, $S_{D1}/S$.

(Second Modification)

In the semiconductor device 200 of the second embodiment above, impurity concentration of the anode region 21 of the diode cell 20 is increased uniformly in comparison with impurity concentration of the base region 11 in the IGBT cell 10. However, impurity concentration across the entire anode region 21 is not necessarily higher than impurity concentration of the base region 11.

Figure 7:
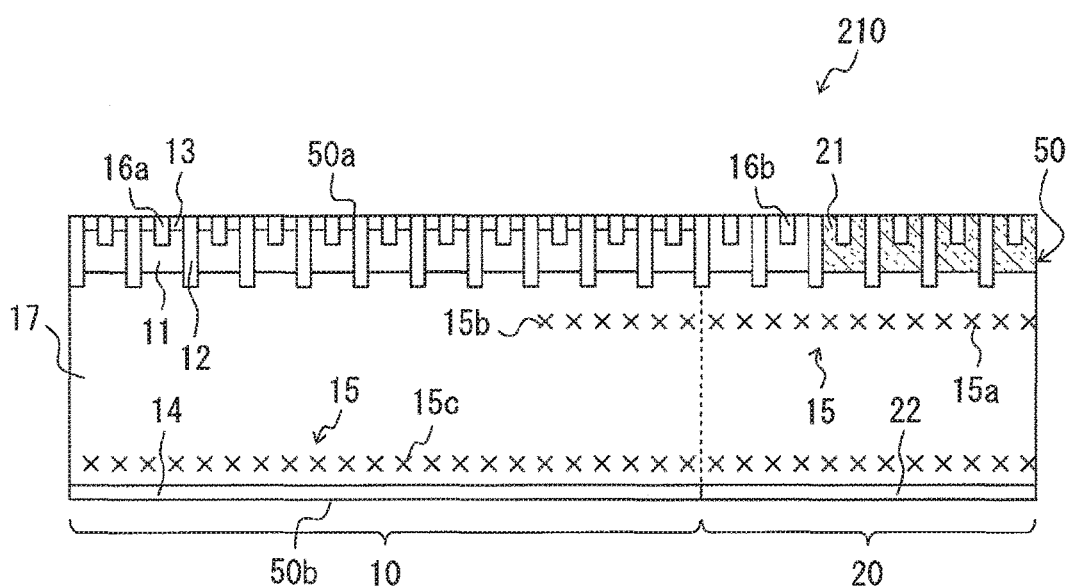
FIG. 7 is a sectional view showing a schematic configuration of a semiconductor device according to a second modification.

The semiconductor device 200 of the second embodiment may be modified in such a manner as shown in FIG. 7 that impurity concentration of the anode region 21 is lower in a portion close to the IGBT cell 10 than in other portions of the anode region 21. In a semiconductor device 210 of the present modification, for example, impurity concentration of the anode region 21 on a side close to the IGBT cell 10 may be same as impurity concentration of the base region 11 in the IGBT cell 10.

In the semiconductor device 210 of the present modification configured as above, an absolute amount of charges during a diode operation can be reduced in comparison with the semiconductor device 200 of the second embodiment above. Hence, a charge injection amount from the IGBT cell 10 to the diode cell 20 can be reduced.

Third Embodiment

The present embodiment will describe a case where a proportion of a charge amount accumulated in a diode cell 20 in a total charge amount is increased.

Figure 8:
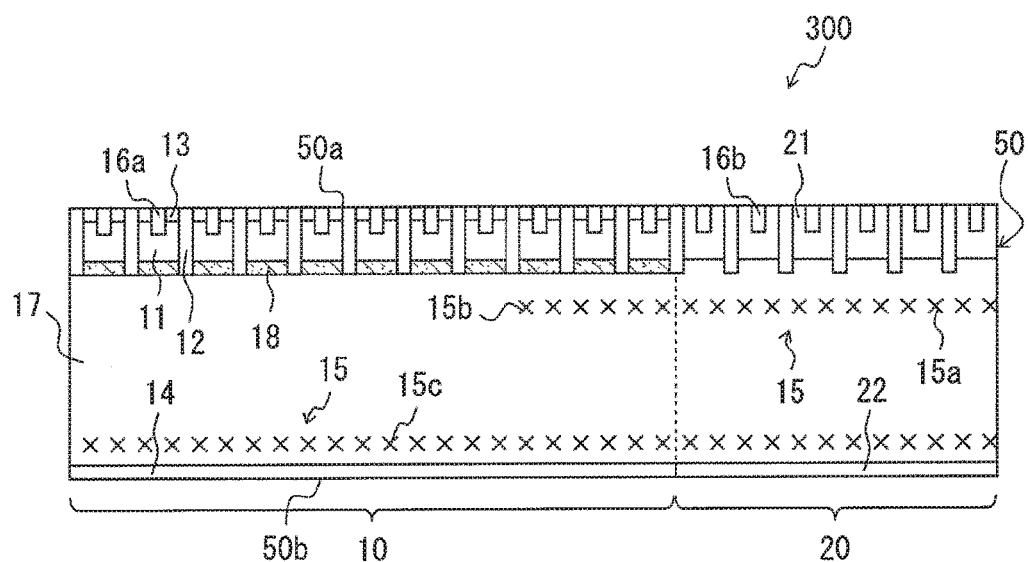
FIG. 8 is a sectional view showing a schematic configuration of a semiconductor device according to a third embodiment.

A semiconductor device 300 of the present embodiment has no condition on an area ratio, $S_{D1}/S$, and, as is shown in FIG. 8, a charge accumulation layer 18 is additionally provided to the semiconductor device 100 of the first embodiment above instead. The charge accumulation layer 18 has higher impurity concentration than a drift region 17 and has n-type conductivity. The charge accumulation layer 18 is provided to an IGBT cell 10 at a location adjacent to a first principal plane 50a than a second defect layer 15b and in contact with a base region 11.

The charge accumulation portion 18 has higher impurity concentration than the drift region 17. Hence, internal potential between the base region 11 and the charge accumulation layer 18 is higher than internal potential between the base region 11 and the drift region 17. Accordingly, a charge (hole) injection amount from the IGBT cell 10 to the diode cell 20 can be reduced, and a proportion of a charge amount accumulated in the diode cell 20 in a total charge amount accumulated in the drift region 17 during diode conduction can be larger than in the IGBT cell 10. In short, Eon+Err can be reduced by reducing a charge (hole) injection amount from the IGBT cell 10 to the diode cell 20.

(Third Modification)

Figure 9:
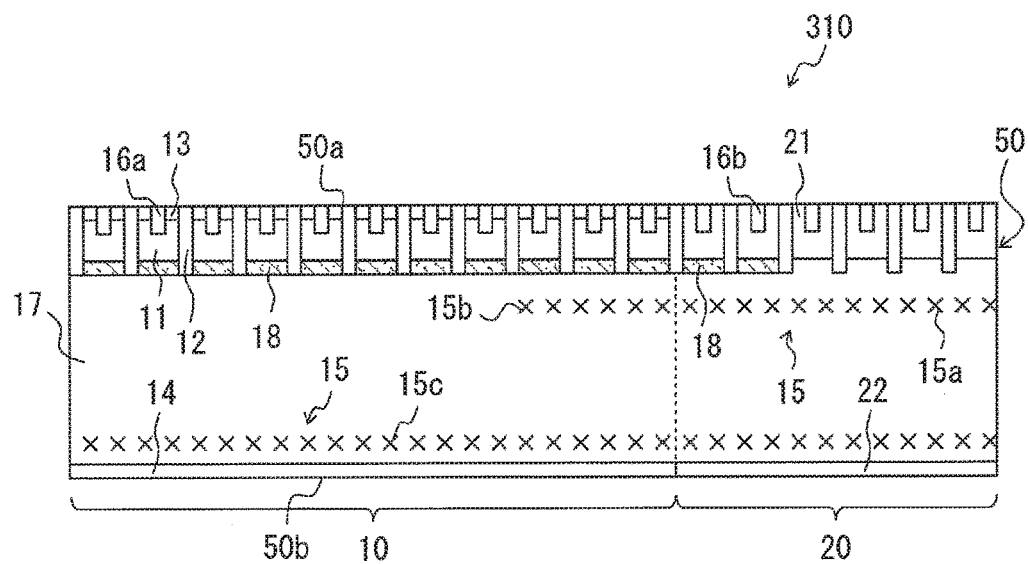
FIG. 9 is a sectional view showing a schematic configuration of a semiconductor device according to a third modification.

The semiconductor device 300 of the third embodiment above has the charge accumulation layer 18 in the IGBT cell 10 alone. By contrast, a semiconductor device 310 of the present modification has a structure as is shown in FIG. 9, in which the charge accumulation layer 18 extends from the IGBT cell 10 to a part of the drift region 17 on a side of the diode cell 20.

The semiconductor device 310 of the present modification configured as above is capable of reducing an absolute amount of charges during a diode operation in comparison with the semiconductor device 300 of the third embodiment above. Hence, a charge injection amount from the IGBT cell 10 to the diode cell 20 can be reduced further.

Fourth Embodiment

The present embodiment will describe a case where a proportion of a charge amount accumulated in a diode cell 20 in a total charge amount is increased as in the third embodiment above.

Figure 10:
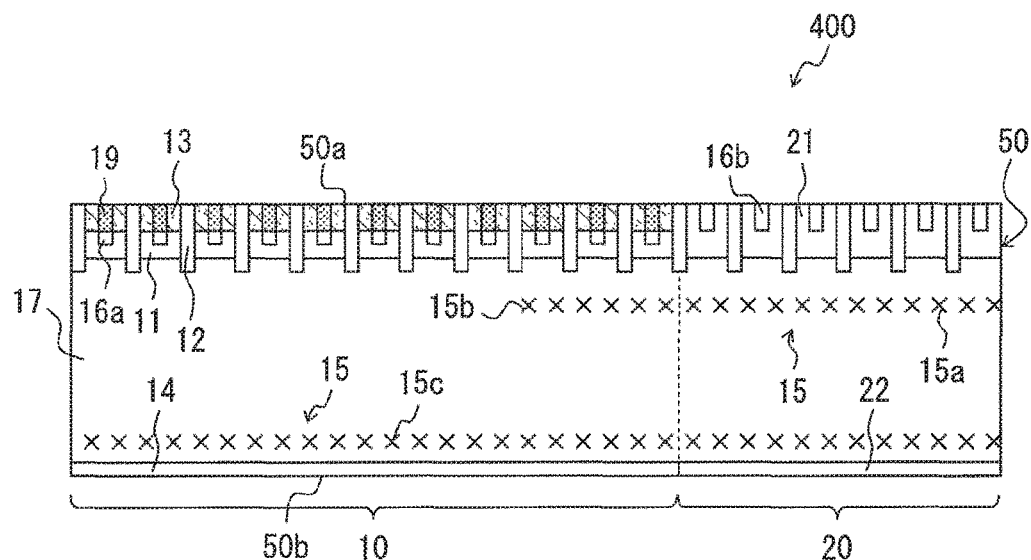
FIG. 10 is a sectional view showing a schematic configuration of a semiconductor device according to a fourth embodiment.

A semiconductor device 400 of the present embodiment has no condition on an area ratio, $S_{D1}/S$, and as is shown in FIG. 10, an embedded contract structure is formed in an IGBT cell 10 on a side of a first principal plane 50a instead.

The semiconductor device 400 provided with the embedded contact structure has a trench contact 19 in addition to the structure of the IGBT cell 10 of the first embodiment above. The trench contact 19 is a conductor disposed between two adjacent trench gates 12 and extends from the first principal plane 50a in a thickness direction of a semiconductor substrate 50, and made of, for example, tungsten. An extended tip end of the trench contact 19 is connected to a base contact region 16a. An emitter region 13 is provided between the trench contact 19 and the trench gate 12. Hence, a base region 11 and the base contact region 16a are not exposed to the first principal plane 50a. In other words, the base region 11 and the base contact region 16a are embedded into the semiconductor substrate 50. The emitter region 13 of the semiconductor device 400 is thus provided deeper than the emitter region 13 of the first embodiment above when viewed from the first principal plane 50a.

Accordingly, a proportion of a charge amount accumulated in the diode cell 20 in a total charge amount accumulated in the drift region 17 during diode conduction can be increased in comparison with the IGBT cell 10. That is, as with the third embodiment above, a charge injection amount from the IGBT cell 10 to the diode 20 can be reduced in comparison with the first embodiment above. Consequently, Eon+Err can be reduced.

(Fourth Modification)

Figure 11:
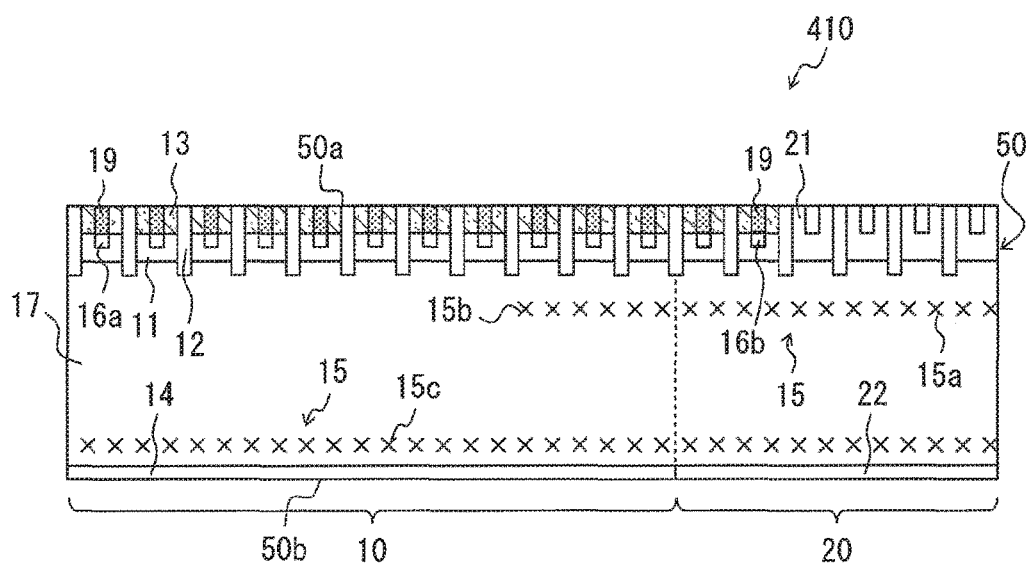
FIG. 11 is a sectional view showing a schematic configuration of a semiconductor device according to a fourth modification.

The semiconductor device 400 of the fourth embodiment above adopts the embedded contact structure in the IGBT cell 10 alone. By contrast, a semiconductor device 410 of the present modification has a structure as is shown in FIG. 11, in which the embedded contact structure extends from the IGBT 10 to a part of a region on a side of the diode cell 20.

The semiconductor device 410 of the present modification configured as above is capable of reducing an absolute amount of charges during a diode operation in comparison with the semiconductor device 400 of the fourth embodiment above. Consequently, a charge injection amount from the IGBT cell 10 to the diode cell 20 can be reduced further.

Fifth Embodiment

The present embodiment will describe a case where a proportion of a charge amount accumulated in a diode cell 20 in a total charge amount is increased as in the third and fourth embodiments above.

Figure 12:
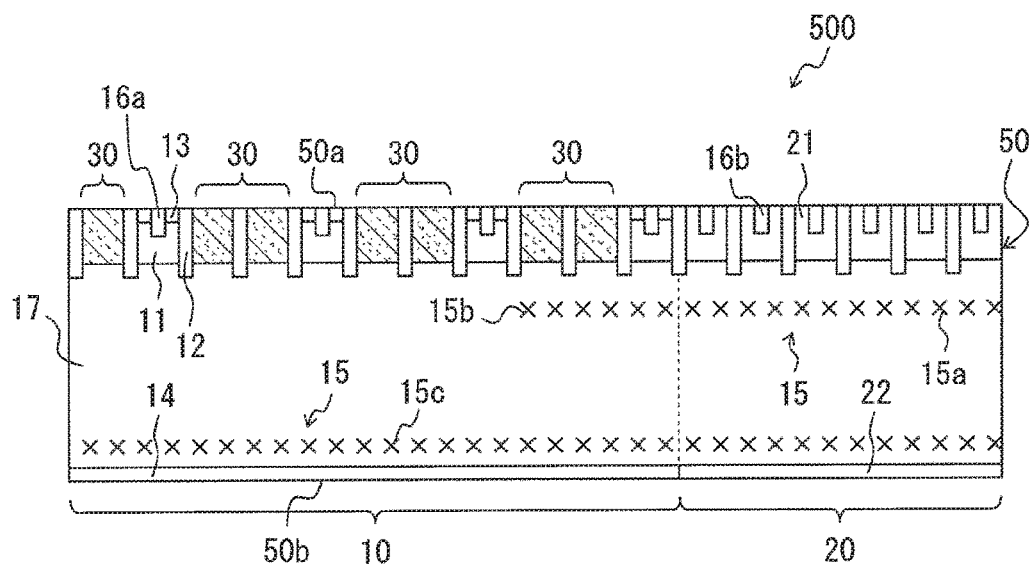
FIG. 12 is a sectional view showing a schematic configuration of a semiconductor device according to a fifth embodiment.

A semiconductor device 500 of the present embodiment has no condition on an area ratio, $S_{D1}/S$, and as is shown in FIG. 12, has a skipping portion 30 in an IGBT cell 10 on a side of a first principal plane 50a instead. The skipping portion 30 is provided in a region between adjacent trench gates 12 and has a structure in which neither an emitter region 13 nor a base contact region 16a is provided and a base region 11 is exposed to the first principal plane 50a. Impurity concentration is set lower in the base region 11 of the skipping portion 30 than in the base region 11 in portions other than the skipping portion 30.

Accordingly, a proportion of a charge amount accumulated in the diode cell 20 in a total charge amount accumulated in a drift region 17 during diode conduction can be increased in comparison with the IGBT cell 10. Hence, a charge injection amount from the IGBT cell 10 to the diode cell 20 can be reduced in comparison with the first embodiment above. Consequently, Eon+Err can be reduced.

(Fifth Modification)

Figure 13:
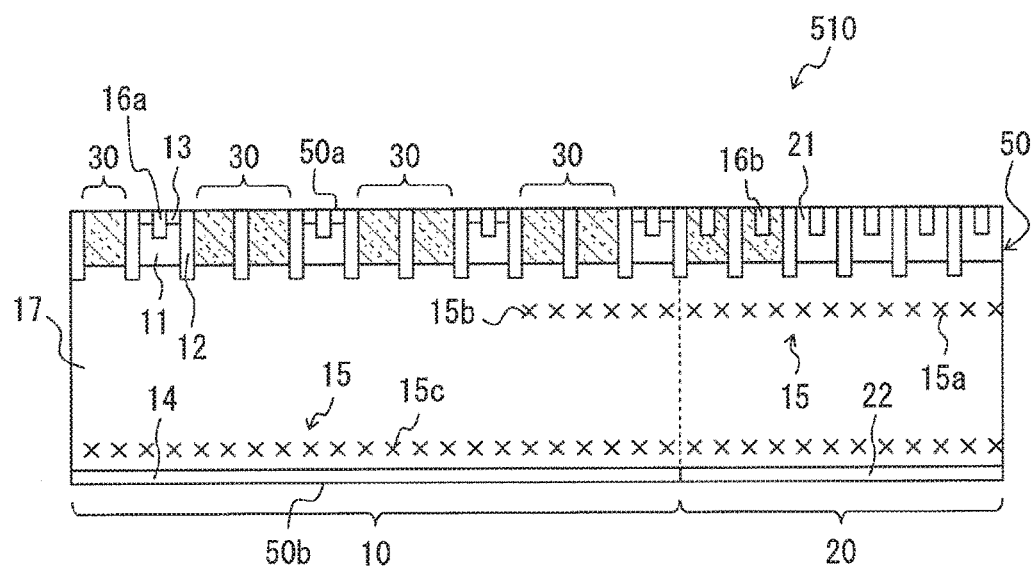
FIG. 13 is a sectional view showing a schematic configuration of a semiconductor device according to a fifth modification.

The semiconductor device 500 of the fifth embodiment above has the skipping portion 30 in the IGBT cell 10 alone. By contrast, in a semiconductor device 510 of the present modification, as is shown in FIG. 13, impurity concentration of an anode region 21 in a portion close to the IGBT cell 10 is made equal to impurity concentration of the base region 11 in the skipping portion 30. In the semiconductor device 510 of the present modification, impurity concentration of the anode region 21 on a side close to the IGBT cell 10 is, for example, same as impurity concentration of the base region 11 in the skipping portion 30.

The semiconductor device 510 of the present modification configured as above is capable of reducing an absolute amount of charges during a diode operation in comparison with the semiconductor device 500 of the fifth embodiment above. Consequently, a charge injection amount from the IGBT cell 10 to the diode cell 20 can be reduced.

Other Embodiment

The preferable embodiments of the present disclosure have been described hereinabove. However, the present disclosure is not limited to the embodiments described hereinabove, but may be implemented by modifying in various other ways without departing from the gist of the present disclosure.

The first embodiment and the first modification above have described a case where the diode cell 20 is of a rectangular shape and a perfect circular shape, respectively. However, the diode cell 20 can be formed into an arbitrary shape. It is only necessary to provide the diode cell 20 to satisfy a relationship of areas expressed by an inequality, $S_{D1} > S$.

The second through fifth embodiments and the second through fifth modifications above may be combined in various manners. For example, impurity concentration of the anode region 21 in the diode cell 20 may be increased as described in the second embodiment above while the charge accumulation layer 18 described in the third embodiment above may be provided to the IGBT cell 10.

The embodiments above have described the configuration having the third defect layer 15c. However, the third defect layer 15c is not necessarily provided and may be provided only when necessary for an ON voltage and a switching loss of the IGBT cell 10, and a forward voltage and a recovery loss in the diode 20. It goes without saying that the third defect layer 15c may be provided to the IGBT cell 10 and the diode cell 20 in part.

The first embodiment and the second through fifth embodiments are embodiments of semiconductor devices according to a same technical idea to reduce a proportion of a charge amount near the interface between the IGBT cell 10 and the diode cell 20 in a total charge amount accumulated during a diode operation, in other words, to increase a proportion of charge amount of the diode cell 20. Hence, while the embodiments and the modifications above have described a trench gate RC-IGBT having the trench gate 12 as an example, configurations of the respective embodiments above are also applicable to a planar RC-IGBT according to the same idea.

The invention claimed is:

1. A semiconductor device comprising:
   a semiconductor substrate having a first principal plane and a second principal plane as a back surface, and including a reverse conducting IGBT in which an IGBT cell and a diode cell are repeatedly and alternately arranged in a first direction along the first principal plane, the IGBT cell having a collector region in a surface layer of the semiconductor substrate adjacent to the second principal plane and the diode cell having a cathode region in the surface layer of the semiconductor substrate adjacent to the second principal plane, the semiconductor substrate including a drift region that forms a charge transfer path between the first principal plane and the second principal plane;
   a first defect layer disposed in the drift region of the diode cell as a lattice defect layer provided by ion irradiation; and
   a second defect layer disposed to extend from the first defect layer of the diode cell and protrude into the IGBT cell, the second defect layer being provided at a same time as the first defect layer, wherein
   a second length of the diode cell in a second direction along the first principal plane and perpendicular to the first direction is greater than a first length of the diode cell in the first direction,
   a region present in the drift region and surrounded by an interface between the IGBT cell and the diode cell orthogonal to the first principal plane, and a plane passing through a boundary between the collector region and the cathode region on a boundary line along an interface between the collector region and the drift region and crossing the first principal plane at an angle of 45 degrees is referred to as a boundary region, and
   the diode cell is disposed to satisfy a relationship of $S_{D1} > S$, in which S is an area occupied by the boundary region and $S_{D1}$ is an area occupied by the diode cell in a surface of the drift region adjacent to the first principal plane.

2. The semiconductor device according to claim 1, wherein
   the diode cell is disposed to satisfy a relationship of $S_{D1} < 5S$.

3. The semiconductor device according to claim 1, wherein
   the diode cell has a perfect circular shape when viewed in a direction orthogonal to the first principal plane.

4. A semiconductor device comprising:
   a semiconductor substrate having a first principal plane and a second principal plane as a back surface, and provided with an IGBT cell having a collector region in a surface layer of the semiconductor substrate adjacent to the second principal plane and a diode cell having a cathode region in the surface layer of the semiconductor substrate adjacent to the second principal plane, and the semiconductor substrate including a drift region that forms a charge transfer path between the first principal plane and the second principal plane;
   a first defect layer disposed in the drift region in the diode cell as a lattice defect layer provided by ion irradiation; and
   a second defect layer disposed to extend from the first defect layer of the diode cell and protrude into the IGBT cell, the second defect layer being provided at a same time as the first defect layer, wherein
   the IGBT cell and the diode cell are provided in such a manner that a density of a current in the drift region when the diode cell is in operation is higher than a density of a current in the drift region when the IGBT cell is in operation; and
   life times of charges in the first defect layer and the second defect layer are set to 0.1 μs to 10 μs by the ion irradiation.

5. The semiconductor device according to claim 4, wherein
   the IGBT cell has a base region provided in a surface layer of the semiconductor substrate adjacent to the first principal plane and the diode cell has an anode region provided in the surface layer of the semiconductor substrate adjacent to the first principal plane, the base region has an impurity concentration that is determined according to a threshold voltage for an operation of the IGBT cell set in advance, and
the anode region has an impurity concentration that is higher than the impurity concentration of the base region.

6. The semiconductor device according to claim 4, wherein
the IGBT cell has a base region provided in a surface layer of the semiconductor substrate adjacent to the first principal plane and the diode cell has an anode region provided in the surface layer of the semiconductor substrate adjacent to the first principal plane,
the base region has an impurity concentration that is determined according to a threshold voltage for an operation of the IGBT cell set in advance,
a portion of the anode region adjacent to the IGBT cell has an impurity concentration same as the impurity concentration of the base region, and
the other portion of the anode region apart from the IGBT cell has an impurity concentration that is higher than the impurity concentration of the base region.

7. The semiconductor device according to claim 4, wherein
the semiconductor substrate includes a charge accumulation layer of a first conductivity type in the drift region of the IGBT cell at a position adjacent to the first principal plane than the second defect layer.

8. The semiconductor device according to claim 7, wherein
the charge accumulation layer is disposed to protrude into a part of the diode cell.

9. The semiconductor device according to claim 4, wherein
the IGBT cell has a base region provided in a surface layer of the semiconductor substrate adjacent to the first principal plane, trench gates provided to be orthogonal to the first principal plane and extending in a depth direction of the semiconductor substrate, and a trench contact provided between adjacent trench gates and extending in the depth direction from the first principal plane, and
the IGBT cell has emitter regions that form current paths to the collector region, the emitter regions are disposed between the trench gates and the trench contact to thereby form an embedded contact structure without exposing the base region to the first principal plane.

10. The semiconductor device according to claim 9, wherein
the diode cell has an anode region in a surface layer of the semiconductor substrate forming the first principal plane to form a current path to the cathode region, and
a part of the anode region of the diode cell adjacent to the IGBT cell forms the embedded contact structure, and is not exposed to the first principal plane.

11. The semiconductor device according to claim 4, wherein
the IGBT cell has a base region in a surface layer of the semiconductor substrate adjacent to the first principal plane, and a skipping portion (30) that is not provided with an emitter region forming a current path to the collector region, and
an impurity concentration of the base region of the skipping portion is lower than an impurity concentration of the base region other than the skipping portion.

12. The semiconductor device according to claim 11, wherein the diode cell has an anode region forming a current path to the cathode region; and
an impurity concentration of the anode region at a part adjacent to the IGBT cell is same as the impurity concentration of the base region in the skipping portion.

13. A semiconductor device comprising:
a semiconductor substrate having a first principal plane and a second principal plane as a back surface, and provided with an IGBT cell having a collector region in a surface layer of the semiconductor substrate adjacent to the second principal plane and a diode cell having a cathode region in the surface layer of the semiconductor substrate adjacent to the second principal plane, the semiconductor substrate including a drift region that forms a charge transfer path between the first principal plane and the second principal plane;
a first defect layer disposed in the drift region of the diode cell as a lattice defect layer provided by ion irradiation; and
a second defect layer disposed to extend from the first defect layer of the diode cell and protrude into the IGBT cell, the second defect layer being provided at a same time as the first defect layer, wherein
a region present in the drift region and surrounded by an interface between the IGBT cell and the diode cell orthogonal to the first principal plane, and a plane passing through a boundary between the collector region and the cathode region on a boundary line along an interface between the collector region and the drift region and crossing the first principal plane at an angle of 45 degrees is referred to as a boundary region,
the diode cell is disposed to satisfy a relationship of $S_{D1} > S$, in which S is an area occupied by the boundary region and SD1 is an area occupied by the diode cell in a surface of the drift region adjacent to the first principal plane, and
a protrusion amount of the second defect layer into the IGBT cell is 300 μm or less.

14. A semiconductor device comprising:
a semiconductor substrate having a first principal plane and a second principal plane as a back surface, and provided with an IGBT cell having a collector region in a surface layer of the semiconductor substrate adjacent to the second principal plane and a diode cell having a cathode region in the surface layer of the semiconductor substrate adjacent to the second principal plane, the semiconductor substrate including a drift region that forms a charge transfer path between the first principal plane and the second principal plane;
a first defect layer disposed in the drift region of the diode cell as a lattice defect layer provided by ion irradiation; and
a second defect layer disposed to extend from the first defect layer of the diode cell and protrude into the IGBT cell, the second defect layer being provided at a same time as the first defect layer, wherein
a region present in the drift region and surrounded by an interface between the IGBT cell and the diode cell orthogonal to the first principal plane, and a plane passing through a boundary between the collector region and the cathode region on a boundary line along an interface between the collector region and the drift region and crossing the first principal plane at an angle of 45 degrees is referred to as a boundary region,
the diode cell is disposed to satisfy a relationship of $S_{D1} > S$, in which S is an area occupied by the boundary region and SD1 is an area occupied by the diode cell in a surface of the drift region adjacent to the first principal plane, the IGBT cell includes a trench gate provided to extend in a depth direction of the semiconductor substrate from the first principal plane and an emitter region provided in a surface layer of the semiconductor substrate adjacent to the first principal plane, and the second defect layer protrudes to a position between the collector region in the surface layer of the semiconductor substrate adjacent to the second principal plane and the emitter region and the trench gate provided in the surface layer of the semiconductor substrate adjacent to the first principal plane.

* * * * *